United States Patent
Wicen

(10) Patent No.: US 6,234,376 B1
(45) Date of Patent: May 22, 2001

(54) SUPPLYING A COVER GAS FOR WIRE BALL BONDING

(75) Inventor: Rudolph M. Wicen, Furlong, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/435,796

(22) Filed: Nov. 8, 1999

Related U.S. Application Data
(60) Provisional application No. 60/143,562, filed on Jul. 13, 1999.

(51) Int. Cl.[7] ............................. B23K 37/00; B23K 11/16
(52) U.S. Cl. ...................... 228/180.5; 228/45; 219/56.22
(58) Field of Search ................... 228/180.5, 4.5, 228/904; 219/56.1, 56.22; 438/617

(56) References Cited

U.S. PATENT DOCUMENTS

| | | | |
|---|---|---|---|
| 3,627,978 | * 12/1971 | Endo et al. | 219/137 |
| 3,643,321 | 2/1972 | Field et al. | 29/470.1 |
| 4,098,447 | 7/1978 | Edson et al. | 228/4.5 |
| 4,323,759 | * 4/1982 | Edson et al. | 219/137 PS |
| 4,390,771 | 6/1983 | Kurtz et al. | 219/56.22 |
| 4,476,366 | * 10/1984 | Kurtz et al. | 219/56.22 |
| 4,564,734 | * 1/1986 | Okikawa | 219/56.22 |
| 4,575,602 | * 3/1986 | Sakurai | 219/56.21 |
| 4,594,493 | * 6/1986 | Harrah et al. | 219/56.22 |
| 4,732,313 | * 3/1988 | Kobayashi et al. | 228/179 |
| 4,861,533 | * 8/1989 | Bertin et al. | 264/81 |
| 4,889,274 | * 12/1989 | Ramsey | 228/179 |
| 4,909,427 | * 3/1990 | Plasted et al. | 228/4.5 |
| 4,976,393 | * 12/1990 | Nakajima et al. | 228/111 |
| 5,249,732 | * 10/1993 | Thomas | 228/179.1 |
| 5,393,948 | * 2/1995 | Bjorkman, Jr. | 219/74 |
| 5,395,037 | * 3/1995 | Takahashi et al. | 228/180.5 |
| 5,433,371 | * 7/1995 | Morisako | 228/180.5 |
| 5,538,176 | * 7/1996 | Hasegawa et al. | 228/180.5 |
| 5,685,476 | * 11/1997 | Miyoshi | 228/180.5 |
| 5,816,480 | * 10/1998 | Nakamura et al. | 228/201 |
| 5,958,259 | * 9/1999 | Miyano | 219/56.22 |
| 6,001,724 | * 12/1999 | Stansbury | 438/617 |

FOREIGN PATENT DOCUMENTS

| | | | |
|---|---|---|---|
| 0276564-A1 | 8/1988 | (EP) . | |
| 2116101 | 9/1983 | (GB) . | |
| 2117299 | 10/1983 | (GB) . | |
| 2131730 | * 6/1984 | (GB) | 228/180.5 |

\* cited by examiner

*Primary Examiner*—Patrick Ryan
*Assistant Examiner*—L. Edmondson
(74) *Attorney, Agent, or Firm*—Synnestvedt & Lechner LLP

(57) ABSTRACT

Method and apparatus for supplying a protective cover gas during ball formation on a wire bonding machine to permit the use of wire formed from metals which may react with air, such as copper or aluminum.

20 Claims, 4 Drawing Sheets

SUPPLYING A COVER GAS FOR WIRE BALL BONDING

CROSS-REFERENCE TO RELATED APPLICATIONS

This application claims the benefit of U.S. Provisional Application No. 60/143,562, filed Jul. 13, 1999.

BACKGROUND OF THE INVENTION

1. Field of the Invention

The invention relates to ball bonding wire leads between substrates such as lead frames, ball grid arrays (BGA's), or chip carriers and integrated circuit chips, and more particularly to a method and apparatus for supplying a protective cover gas during ball formation to permit the use of wire formed from metals which may react with air, such as copper or aluminum.

2. Description of Related Art

One of the many steps involved in the fabrication of integrated circuit packages is wire bonding of the semiconductor die contact pads to the lead frame or chip carrier. Particularly, once a semiconductor die has been fully fabricated and diced from the wafer, it is mounted onto a lead frame or chip carrier package. At this point, the contact pads on the surface of the die must be electrically coupled to the pins of the lead frame so that signals may pass to and from the die to external circuitry through the pins on the lead frame. The pins will protrude from the final molded integrated circuit package within which the die will ultimately be encased during fabrication. Generally, each contact pad is electrically coupled to one pin on the lead frame by means of wire bonding.

Wire-bonding machines electrically connect the contact pads on the die to the electrical paths (i.e., pins) on the lead frame by placing a jumper wire which runs from the contact pad on the die surface to the conductive path on the lead frame. In jumper wire bonding, a fine lead or bonding wire is held in a capillary tool so that the lead wire projects beyond the end of the tool. The capillary tool forms part of a ball-bonding machine in which the tool is appropriately mounted and positioned over the metalized die pad of an integrated circuit chip. Descriptions of ball-bonding machines are set forth in U.S. Pat. Nos. 3,643,321; 4,098,447 and 4,323,759, incorporated herein by reference.

In a typical bonding process, the end of the lead wire is formed into a ball of molten metal by, for example, causing an arc discharge between the bonding wire and an electrode which is placed very close to the end of the wire protruding from the capillary tool. This electrode is commonly termed the electrical flame-off or EFO electrode. The melted portion of the metal at the end of the lead wire forms a spherical ball under surface tension. After solidification of at least the surface of the ball, the capillary tool is lowered so that the lead wire is brought into contact with the metalized die pad, or other substrate, and a bond is formed by thermocompression and/or ultrasonic bonding. See, for example, U.S. Pat. Nos. 4,390,771; 4,476,366 and 4,909,427, incorporated herein by reference.

The wire used in such ball-bonding processes may be a non-reactive metal such as gold, or a more reactive metal such as copper, silver, palladium or aluminum. When reactive metals such as copper or aluminum are melted in air, they may react with oxygen to form oxides which interfere with bonding. It is therefore desirable to provide a protective cover gas which does not react with the metal around the molten ball, at least until the surface has solidified and cooled sufficiently to become non-reactive. U.S. Pat. Nos. 4,390,771 and 4,909,427 describe methods and apparatus for providing such a cover gas in which a moveable shroud or shield moves into position before ball formation. The shroud is then filled with a cover gas and the ball is formed at the end of a capillary tool. The shroud is then removed, and the ball-bonding process is completed. Such apparatus require complex movement of the shroud relative to the capillary tool, requiring control equipment and adding steps to the bonding process. Furthermore, the rapid removal of the shroud after ball formation causes a sudden rush of air to impinge on the hot wire ball. The air can cause surface oxidation of reactive metals, as well as uneven cooling of both reactive and non-reactive metals. Furthermore, the open-ended shroud requires a relatively large amount of gas to maintain a cover around the capillary tool and must be refilled at the beginning of each cycle.

A different method and apparatus for providing a cover gas in a ball-bonding process is set forth in U.S. Pat. No. 4,575,602. In this patent, a moveable coaxial open cylindrical shroud is provided around the capillary tube. At the beginning of the ball forming process, the shroud is moved into place surrounding the end of the capillary tool. An electrode is also moved into place below the end of the cylinder and close enough to the capillary tool to form an arc discharge to the wire. The cylinder is then filled with the cover gas and the arc discharge is initiated. After formation of the ball, the electrode is withdrawn and the cylinder is raised to permit the end of the capillary tool to be lowered towards a die pad to complete the ball-bonding process. This process requires precise timing and complex movement of the different components. The open-ended cylinder requires a relatively high continuous flow of gas to maintain the cover during ball formation and must be refilled at the beginning of each operating cycle.

In a fully automated fabrication facility, thousands of dies can be run in a single day comprising tens of thousands of wire bonds. It can be seen that wire-bonding machines are an integral part of a semiconductor fabrication line and that efficient operation of such equipment can have a significant impact on the rate at which integrated circuits chips can be fabricated. Accordingly, it is desirable to ensure that all components of the apparatus work together in a well-coordinated operation.

Accordingly, it is an object of the present invention to provide a method for supplying a cover gas to a ball-bonding process which method is able to work in an efficient and coordinated operation with the other steps of a ball-bonding process.

Another object is to provide apparatus for supplying a cover gas to a ball-bonding process which apparatus is able to work in an efficient and coordinated operation with the other components of a ball-bonding apparatus.

It is a further object of the present invention to provide a method and apparatus which minimize the amount of cover gas required to protect the molten ball formed such ball-bonding processes.

SUMMARY OF THE INVENTION

In accordance with the present invention, apparatus is provided for supplying a cover gas to a ball-bonding assembly to protect the molten ball from the effects of exposure to air. The apparatus comprises a gas-containment tube for receiving a shielding gas, the tube having transverse in-line orifices through which the capillary head of the ball-bonding machine can pass. The electrode of an electric flame-off (EFO) device is positioned in the tube such that when the capillary head is in a first position and upon energizing of the EFO, an arc discharge can be formed between the electrode and the end of a bonding wire which is fed through the capillary head, thereby forming a molten ball at the end of the wire.

In the process of the present invention, the gas-containment tube is supplied with an inert and/or reducing gas. The capillary head is moved to a first position adjacent the electrode of the EFO. The EFO is energized to form an arc discharge between the electrode and the end of the bond wire which is fed through the capillary head. After a molten ball forms at the end of the wire, the EFO is de-energized and the ball allowed to at least partially solidify. The capillary head is then advanced through the second orifice of the gas-containment tube and contacted with a substrate, such as a die pad, to form the desired wire bond. During this entire operation, a desired level of the cover gas is maintained in the containment tube.

DETAILED DESCRIPTION OF THE INVENTION

Figure 1:
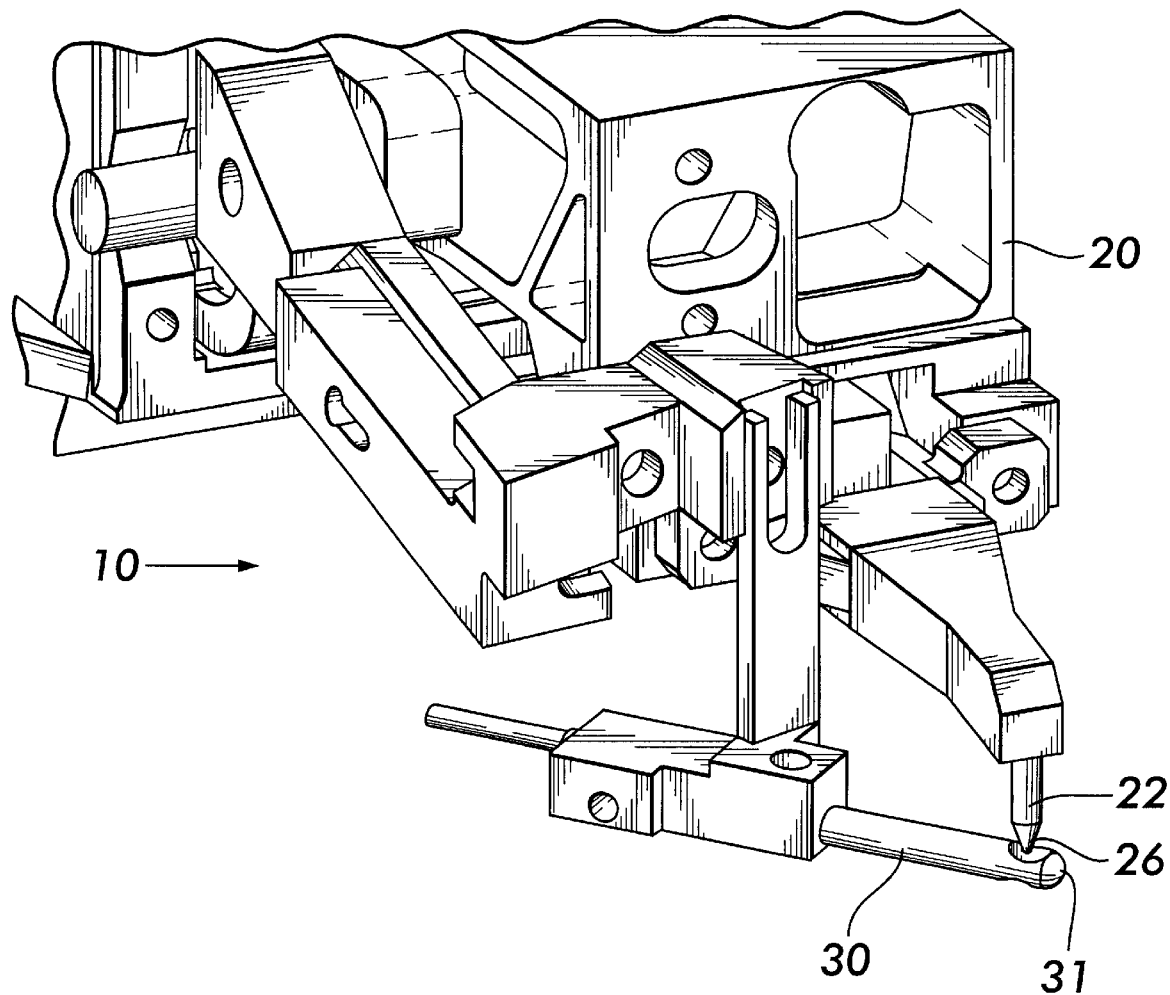
FIG. 1 is a perspective view of the head assembly of a wire-bonding machine with a cover-gas supply apparatus in accordance with the present invention.
Figure 2:
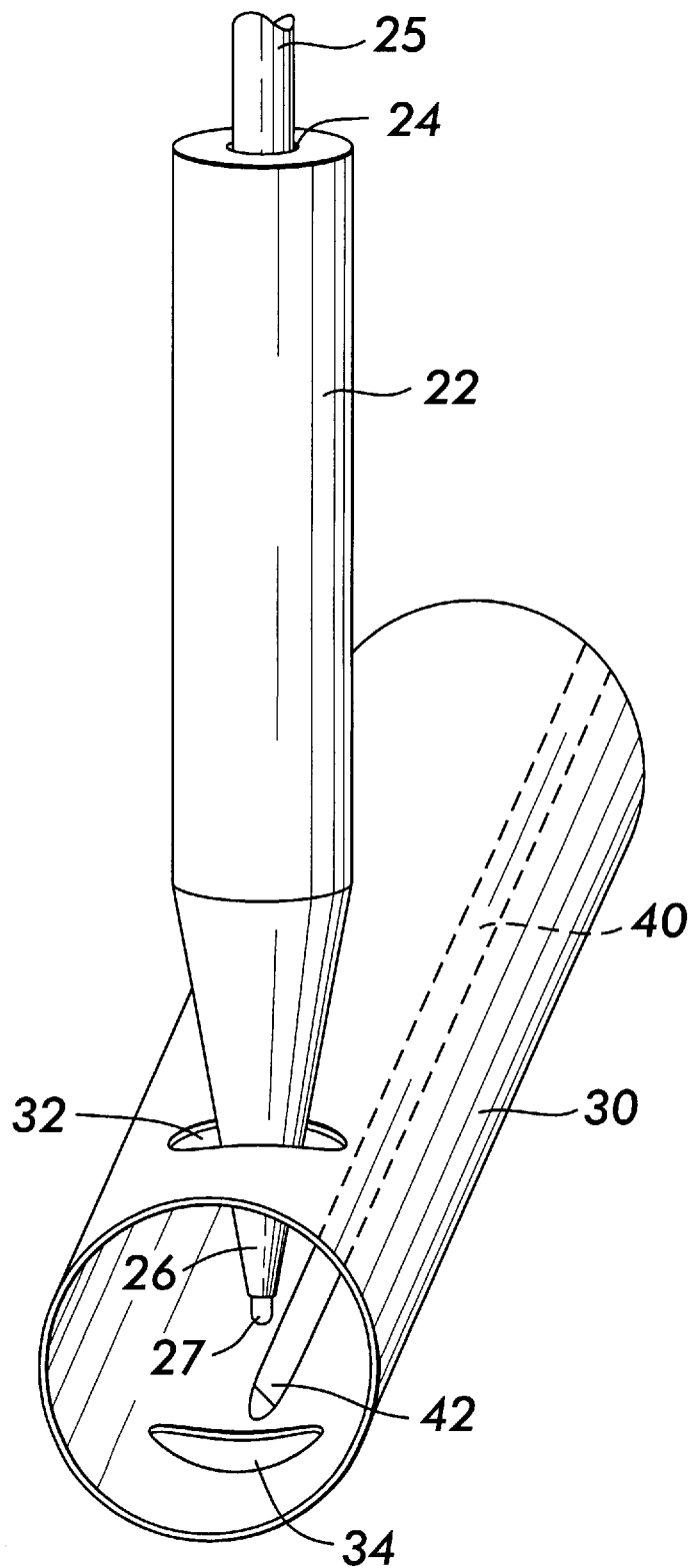
FIG. 2 is a close-up, cut-away perspective view of the cover-gas supply apparatus shown in FIG. 1.

The following description of a first embodiment of the device of the present invention is made with reference to FIGS. 1 and 2. FIG. 1 shows a bond head of an exemplary wire-bonding machine with a cover-gas supply apparatus in accordance with the present invention. Bond head 10 comprises a frame member 20 for mounting the bond head on a movable carriage assembly of a bonding machine (not shown) and for supporting other components. A capillary head 22 is mounted on frame member 20 for up and down reciprocating movement. Capillary head 22 is provided with a central bore 24 through which a bond wire 25 is fed, with the end 27 of bond wire 25 shown extending through the tip 26 of capillary head 22.

A gas-containment tube 30 is provided with top and bottom in-line orifices 32 and 34 through which the tip 26 of capillary head 22 can pass. Tube 30 should be made of a non-conductive, heat resistant material, such as a glass or ceramic. A gas supply (not shown) provides the desired cover gas to tube 30. Preferably, tube 30 includes an end cap 31 to contain the cover gas.

As shown in FIG. 2, an electric flame off (EFO) probe 40 terminating with electrode 42 extends along the inside bottom of tube 30. Electrode 42 is positioned to allow formation of an electrical discharge arc with end 27 of bond wire 25 during bonding operations.

Figure 4:
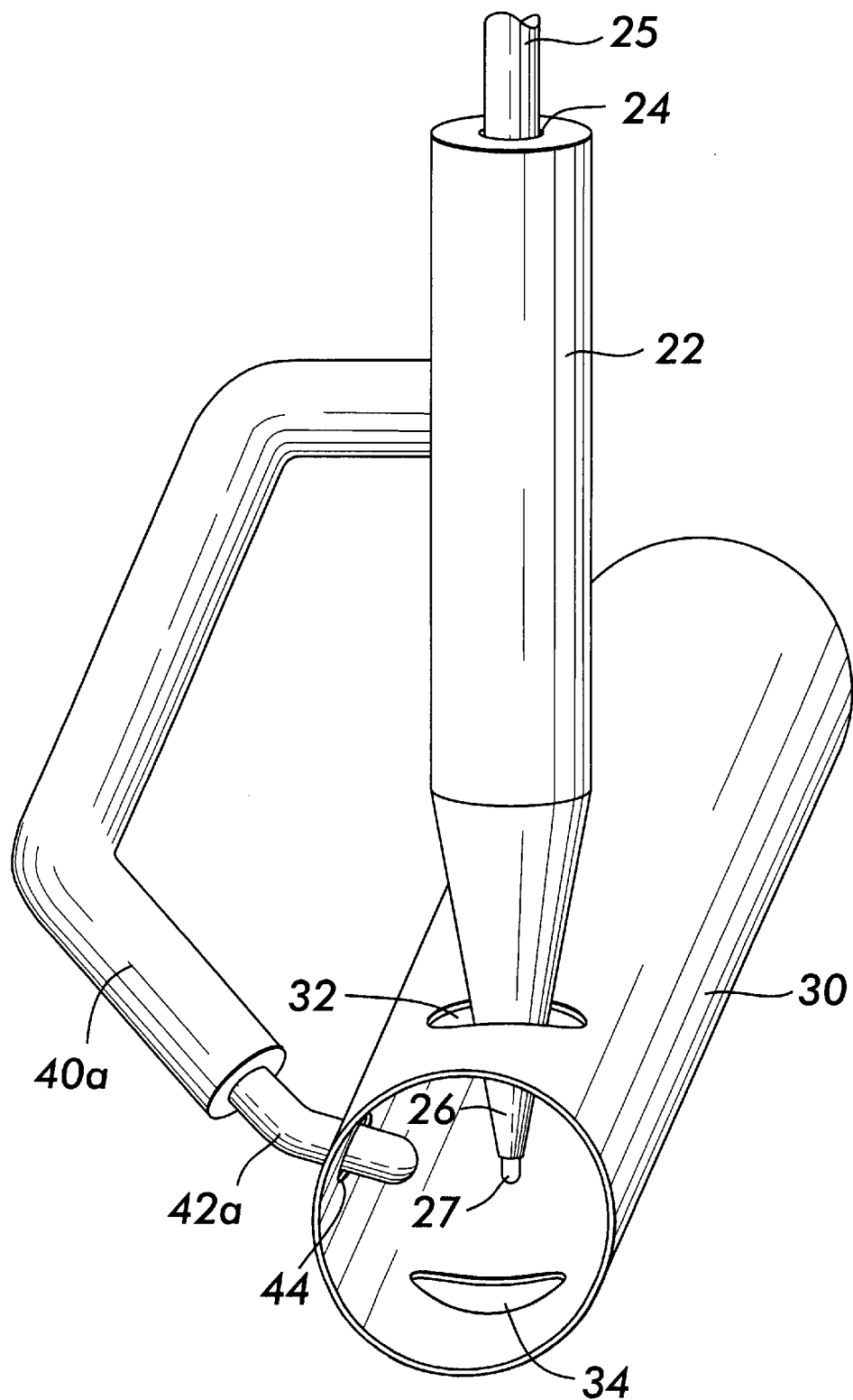
FIG. 4 is a close-up, perspective view of the cover-gas supply apparatus shown in FIG. 3.

A second embodiment of the cover-gas supply apparatus of the present invention is shown in FIGS. 1 and 2. In this embodiment EFO probe 40a comprising an electrode 42a extends through an orifice 44 in the side of tube 30. As with the first embodiment, electrode 42a is positioned to allow formation of an electrical discharge arc with end 27 of bond wire 25 during bonding operations In operation, bond wire 25 passes through bore 24 and extends beyond the end of tip 26 to expose wire end 27. Gas containment tube 30 is filled and maintained with an appropriate non-reactive and/or reducing gas. Tip 26 of capillary head 22, which is mounted for reciprocal up-and-down movement, is moved to a first position adjacent electrode 42 or 42a. This is the position shown in both FIGS. 2 and 4. EFO 40 or 40a is energized to form a discharge arc between electrode 42 or 42a and end 27 of bond wire 26, causing a molten metal ball to form. The EFO is de-energized, and the ball is allowed to solidify, at least partially. Tip 26 of capillary head 22 is then advanced through orifice 34 to bond the ball to a substrate, such as a die pad (not shown). In a typical use a length of the wire is then drawn out and bonded to a second contact, as is well known in the art. Once the wire bond is completed, capillary head 22 can be returned to its first position to repeat the process.

Capillary head 22 can be formed of any of the normal ceramic materials such as alumina, sapphire, ruby, titanium carbide, etc., used for such heads. Such heads are available commercially from numerous manufacturers, and are sized and shaped for a particular wire diameter and/or ball-bonding alloy and operation.

Gas-containment tube 30 should be made of a non-conductive which is capable of withstanding the effects of the heat and electric arc discharges used during ball formation. Suitable materials include ceramics and heat resistant glasses. Clear quartz glass is particularly advantageous because it allows observance of the ball forming operation. Heat resistant plastics have also been used, but tend to be affected by exposure to the arc discharges.

Tube 30 is shown in the figures as having a round cross section. The tube can be of other desired shapes, such as a square cross section. A possible advantage of a square cross section is that when the tube is formed of a hard and/or brittle material it may be easier to form orifices 32 and 34 through a flat rather than a curved surface.

Figure 3:
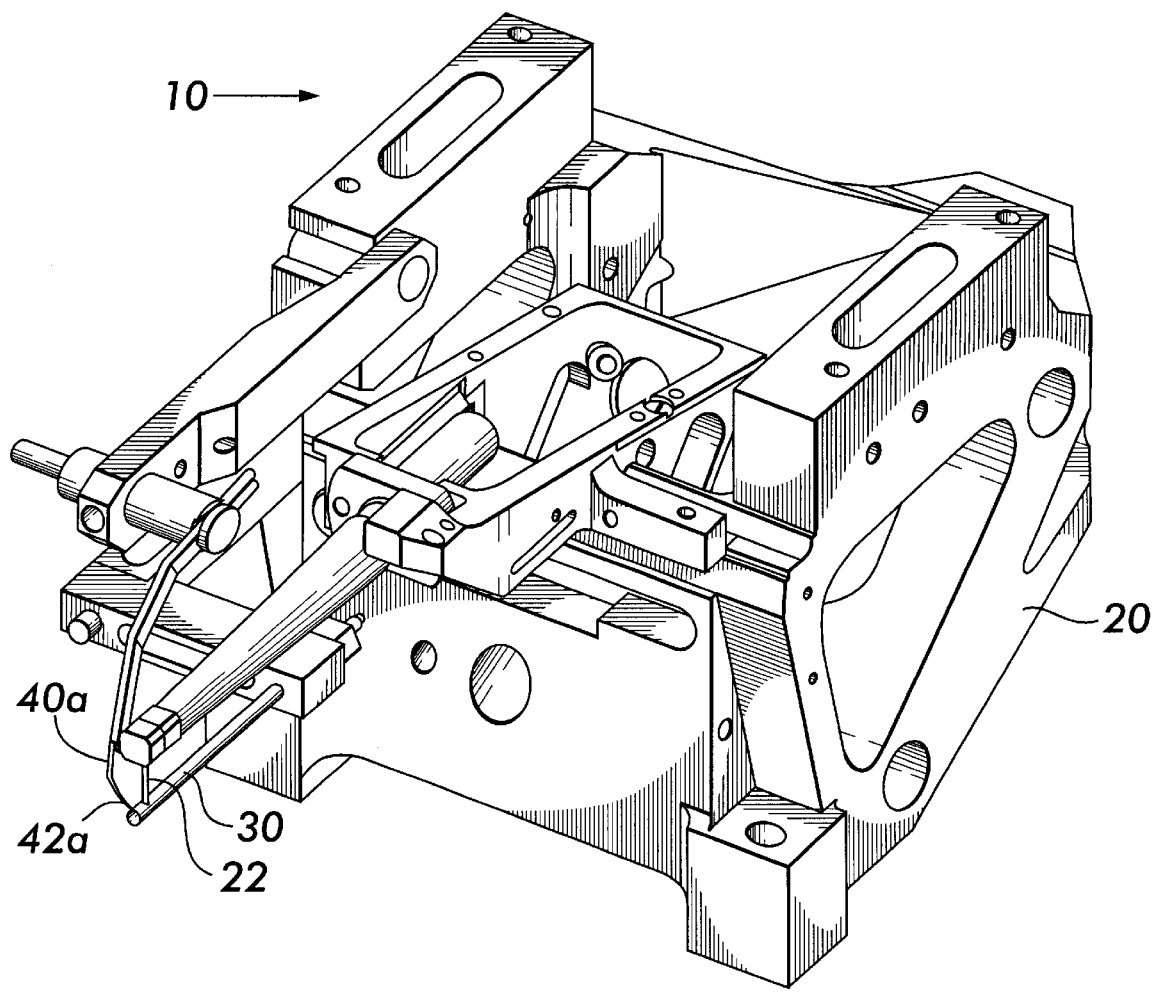
FIG. 3 is a perspective view of the head assembly of a wire-bonding machine with a cover-gas supply apparatus in accordance with another embodiment the present invention.

Tube 30 is shown in FIG. 1 with end cap 31, and in FIG. 3 with an open end. An end cap preferably is provided to contain the cover gas in the tube more effectively. Alternatively, an open tube can be provided which extends far enough beyond orifices 32 and 34 such that the gas flow will maintain full coverage of the molten wire ball. This is less desirable due to the loss of gas through the open end of the tube, but may be necessary because of the difficulty of fitting an end cap on ceramic or glass materials.

As discussed above, electric flame-off probe 40 can run along the inside bottom of the tube 30, or a probe 40a may extend through the wall of tube 30. Among the advantages of having the probe run along the inside of the tube is that it is not necessary to form an additional orifice 44 through the tube wall, which is difficult with a ceramic or glass tube. Furthermore, probe 40 is in a fixed position within tube 30, and does not require separate mounting and positioning as would be necessary with probe 40a. Although shown in certain positions with respect to tube 30, probe 40 or 40a can be in any position provided the desired arc discharge can be formed. For example, probe 40 could be mounted on the outside bottom or inside top of tube 30, instead of on the inside bottom as shown.

When the wire is formed of a reactive metal such as copper or aluminum, the cover gas should be non-reactive with the metal and preferably reducing. Preferably, the cover gas is an effectively inert gas such as nitrogen or argon. A reducing gas, generally hydrogen, may be added to react preferentially with any oxygen which may be present. However, tests indicate that the cover-gas apparatus of the present invention is so effective at excluding air from the ball-forming area that little or no hydrogen is needed in the cover gas. This is a further advantage of the present invention because of the difficulties of using large quantities of highly flammable hydrogen.

The apparatus of the present invention is also advantageous to use with non-reactive bonding wire, such as gold wire. The apparatus can provide a shield of clean, non-turbulent gas which permits a molten gold ball to solidify more slowly and uniformly than if an uncontrolled stream of air or gas were impinging on it. When the apparatus is used with a noble metal such as gold, any gas which is non-reactive with that metal may be used.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

The invention claimed is:

1. A wire ball-bonding apparatus comprising a capillary head having a tip through which a metal bonding wire can be fed, a gas-containment tube having first and second in-line transverse orifices through which the tip of the capillary head can pass, and an electric flame-off device having an electrode which is positioned to be able to form an arc discharge in the tube with the end of the bonding wire, wherein said gas-containment tube and said electric flame-off device are stationary during ball bonding.

2. The apparatus of claim 1 wherein the electrode is positioned inside the gas-containment tube and does not pass through the side of the tube.

3. The apparatus of claim 1 wherein the electrode is embedded within the wall of the gas-containment tube.

4. The apparatus of claim 1 wherein the electrode extends through a third orifice in the side of the gas-containment tube.

5. The apparatus of claim 1 further comprising an end cap at one end of the gas-containment tube.

6. The apparatus of claim 1 wherein the gas-containment tube is round in cross section.

7. The apparatus of claim 1 wherein the gas-containment tube is rectangular in cross section.

8. The apparatus of claim 1 wherein the gas-containment tube is made from a ceramic material.

9. The apparatus of claim 1 wherein the gas-containment tube is made from a glass material.

10. The apparatus of claim 9 wherein the gas-containment tube is made from quartz glass.

11. The apparatus of claim 1 further comprising a source of gas coupled to supply gas to said gas-containment tube.

12. The apparatus of claim 1 wherein said first and second orifices are of size, shape and position so that said capillary head can be positioned in a first position such that said tip extends within said tube through said first orifice such that said tip is adjacent said electrode and in a second position such that said tip extends through said first and second orifices without said tube.

13. A method for forming a wire ball bond using a wire ball-bonding apparatus comprising a capillary head having a tip through which a metal bonding wire can be fed, a gas-containment tube having first and second in-line transverse orifices through which the tip of the capillary head can pass, and an electric flame-off device having an electrode, said method comprising the steps of:

charging a cover gas to the gas-containment tube;

positioning the tip of the capillary head through the first transverse orifice in the gas-containment tube;

feeding the bonding wire through the tip of the capillary head;

energizing the electric flame-off device to form an arc discharge between the electrode and the end of the bonding wire thereby forming a molten ball at the end of the bonding wire;

de-energizing the electric flame-off device, advancing the tip of the capillary head through the second transverse orifice of the gas-containment tube; and forming a bond between the ball and a substrate outside the gas-containment tube;

wherein said gas-containment tube and said electric flame-off device are stationary during said steps.

14. The method of claim 13 wherein the cover gas is inert to the metal of the molten wire ball.

15. The method of claim 13 wherein the wire comprises copper or aluminum.

16. The method of claim 15 wherein the cover gas is inert to the metal of the molten wire ball.

17. The method of claim 16 wherein the cover gas is argon.

18. The method of claim 13 further comprising permitting the ball to at least partially solidify before advancing the tip of the capillary head through the second orifice.

19. A method for forming a wire ball bond using a wire-bonding machine comprising a capillary head having a tip through which a wire to be bonded may extend, said method comprising the steps of:

positioning said capillary head so that said tip extends through a first orifice into a gas-containment tube;

charging said gas-containment tube with a cover gas;

feeding bonding wire through said tip of said capillary head such that an end of said wire is within said tube;

melting said end of said wire within said tube;

advancing said tip of said capillary head through a second orifice in said tube without moving said tube such that said tip and said melted portion of said wire are without said tube: and forming a bond between the ball and a substrate outside the gas-containment tube.

20. A method as set forth in claim 19 wherein said melting step comprises:

creating an arc between said end of said wire and an electrode positioned within said tube.

* * * * *